(12) United States Patent
Bae

(10) Patent No.: US 6,909,335 B2
(45) Date of Patent: Jun. 21, 2005

(54) OSCILLATOR FOR DC—DC CONVERTER

(75) Inventor: Jong-Hyug Bae, Seoul (KR)

(73) Assignee: LG Electronics Inc., Seoul (KR)

( * ) Notice: Subject to any disclaimer, the term of this patent is extended or adjusted under 35 U.S.C. 154(b) by 36 days.

(21) Appl. No.: 10/379,238

(22) Filed: Mar. 4, 2003

(65) Prior Publication Data

US 2003/0164739 A1 Sep. 4, 2003

(30) Foreign Application Priority Data

Mar. 4, 2002 (KR) .............................. 10-2002-0011402

(51) Int. Cl.[7] .............................................. H03B 5/20
(52) U.S. Cl. ....................... 331/135; 331/175; 323/222; 323/282; 327/536
(58) Field of Search .............................. 331/135, 175; 327/337, 345, 344, 536; 323/222, 282

(56) References Cited

U.S. PATENT DOCUMENTS 6,147,541 A * 11/2000 Seesink ...................... 327/337

* cited by examiner

*Primary Examiner*—Arnold Kinkead
(74) *Attorney, Agent, or Firm*—Lee, Hong, Degerman, Kang & Schmadeka

(57) ABSTRACT

An oscillator for a DC-DC converter, which is able to obtain constant frequency by using trans-conductance value as a clock of the DC-DC converter to make an output insensitive for process changes, comprises: a trans-conductance unit calculating trans-conductance value according to input voltage, deciding and outputting current according to the input voltage; a capacitor charged by the current outputted from the trans-conductance unit; and an amp-type Schmitt trigger comparing the voltage charged in the capacitor to threshold voltage, and outputting the compared value.

15 Claims, 3 Drawing Sheets

OSCILLATOR FOR DC—DC CONVERTER

CROSS-REFERENCE TO RELATED APPLICATIONS

Pursuant to 35 U.S.C. §119(a), this application claims the benefit of an earlier filing date and right of priority to Korean Application No. 10-2002-0011402, filed on Mar. 4, 2002, the contents of which are hereby incorporated by reference herein in their entirety.

BACKGROUND OF THE INVENTION

1. Field of the Invention

The present invention relates to a DC-DC converter, and particularly, to an oscillator for a DC-DC converter which is able to obtain constant frequency by making output insensitive for changes of voltage and process.

2. Description of the Background Art

Recently, with development of mobile products, DC-DC converter is mainly used for driving controllers or display drivers which control the mobile products, and also, an RC oscillator is mainly used for generating clock of the DC-DC converter.

FIG. 1 is an exemplary view showing a structure of the RC oscillator according to the conventional art.

As shown therein, in the conventional RC oscillator, a resistor (R) and a capacitor (C) are connected in parallel, and a CMOS Schmitt trigger 10 compares high first threshold voltage or low second threshold voltage, which is set in advance, to inputted voltage ($V_{in}$) and after that, outputs voltage corresponding to the compared value as inverting it, and feed-forwards the outputted voltage through the resistor R.

FIG. 2 is a detailed circuit diagram showing a structure of the CMOS Schmitt trigger 10 shown in FIG. 1.

As shown therein, the CMOS Schmitt trigger 10 is configured to connect gates of first and second PMOS transistors MP1 and MP2 and gates of first and second NMOS transistors MN1 and MN2 to input side, to connect a contact point between a drain of the first PMOS transistor MP1 and a source of the second PMOS transistor MP2 to a source side of a third PMOS transistor MP3, to connect a contact point between source side of the first NMOS transistor MN1 and a drain of the second NMOS transistor MN2 to which the source is grounded to source side of a third NMOS transistor MN3, to connect a contact point of the drain of the third PMOS transistor MP3 and the drain of the first NMOS transistor MN1 or a contact point of the gate of the third PMOS transistor MP3 and the gate of the third NMOS transistor MN3 to output side after connecting them respectively, and operations of the CMOS Schmitt trigger 10 will be described as follows.

First, high threshold voltage of the CMOS Schmitt trigger 10 is decided by active resistance of the first and third PMOS transistors MP1 and MP3, and the low threshold voltage of the trigger 10 is decided by active resistance of the first and third NMOS transistors MN4 and MN6.

Therefore, the CMOS Schmitt trigger 10 outputs inputted voltage $V_{in}$ after inverting the voltage in a state that the high and low threshold voltages are decided, and at the same time, is inputted the voltage as much as the voltage drop generated by the capacitor C and the resistor R to process the voltage.

As described above, the RC oscillator mainly consists of the CMOS Schmitt trigger 10, and the CMOS Schmitt trigger 10 is able to obtain the threshold voltage easily by using digital processes in a linear area.

However, when the PMOS and NMOS transistors are used in the linear area, the precise resistance according to the voltages and processes can not be obtained due to the property of the transistor, and therefore, the threshold voltage can be changed from the value set in fabrication process. Therefore, the oscillator is directly affected by the frequency changes, and the RC oscillator can not be used unless the system has a large frequency modulation gain.

Also, the RC oscillator includes the resistor and the capacitor constructed in parallel, and the frequency may be changed by the capacitor, as described above.

SUMMARY OF THE INVENTION

Therefore, an object of the present invention is to prevent threshold voltage changing generated in case that a CMOS Schmitt trigger is used, or to improve frequency changing due to parasitic capacitor generated on both ends of a resistor in an oscillator.

Another object of the present invention is to provide an oscillator for a DC-DC converter which is able to obtain an output insensitive for process changes and to use the output as a clock of the DC-DC converter, by outputting one of positive and negative currents from a trans conductance (trans-conductance) unit having same functions as those of resistor in an RC oscillator, charging/discharging a capacitor according to the output, comparing voltage of the capacitor to high or low threshold voltage, and outputting output voltage to be high potential or low potential corresponded to the capacitor voltage.

To achieve the objects of the present invention, as embodied and broadly described herein, there is provided an oscillator for a DC-DC converter comprising: a trans conductance unit calculating trans conductance value according to input voltage, deciding an outputting electric current (lo) according to the input voltage; a capacitor charged by the electric current (lo) outputted from the trans conductance unit; and an amp-type Schmitt trigger comparing the voltage charged in the capacitor to a threshold voltage, and outputting the compared value.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
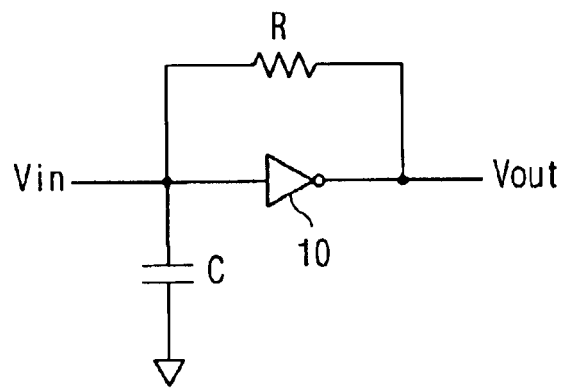
FIG. 1 is an exemplary view showing a configuration of an RC oscillator according to the conventional art.
Figure 2:
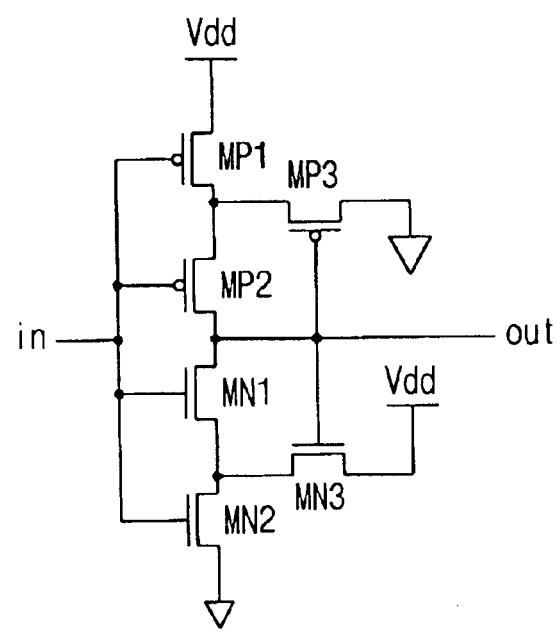
FIG. 2 is a detail circuit diagram showing a configuration of a CMOS Schmitt trigger in FIG. 1.
Figure 3:
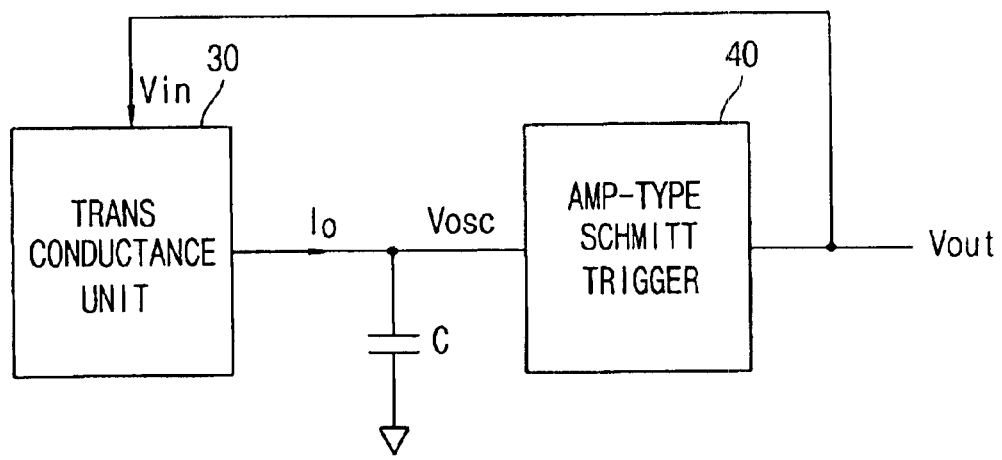
FIG. 3 is an exemplary view showing a configuration of a trans-conductance oscillator according to the present invention.

FIG. 3 is an exemplary view showing a configuration of a trans conductance oscillator according to the present invention.

As shown therein, the trans conductance oscillator according to the present invention comprises: a trans conductance unit 30 calculating trans conductance value according to input voltage $V_{in}$, deciding positive current (+lo) or negative current (−lo) according to bias voltage BIAS1 and BIAS 2 and the input voltage $V_{in}$ and outputting the current to output side; a capacitor C which is charged by the output current (+lo, −lo) outputted from the trans conductance unit 30; and an amp-type Schmitt trigger 40 comparing the voltage charged in the capacitor C to the threshold voltage, and outputting the compared value.

Also, the amp-type Schmitt trigger 40 comprises: a comparing unit 41 comparing high threshold voltage $V_H$ or low threshold voltage $V_L$ to the voltage inputted into the input side (in), inverting electric current of a certain level corresponding to the compared value, and outputting the current; and an inverter 42 for inverting the output signal of the comparing unit 41 and outputting the signal to the trans conductance unit 30 and to the DC-DC converter. Herein, the voltage inputted into the input side (in) means the voltage charged in the capacitor C.

Figure 4:
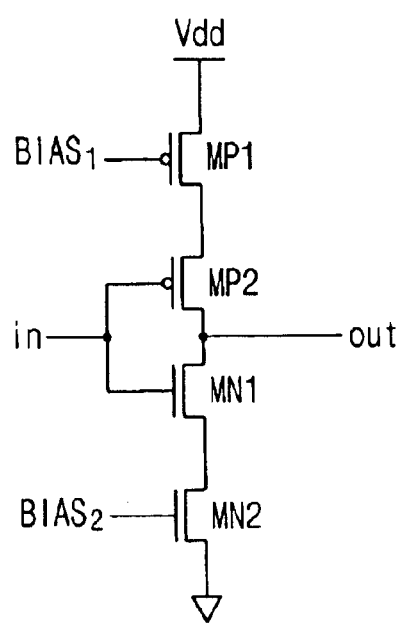
FIG. 4 is a detailed circuit diagram showing a configuration of an trans-conductance unit shown in FIG. 3.
Figure 5:
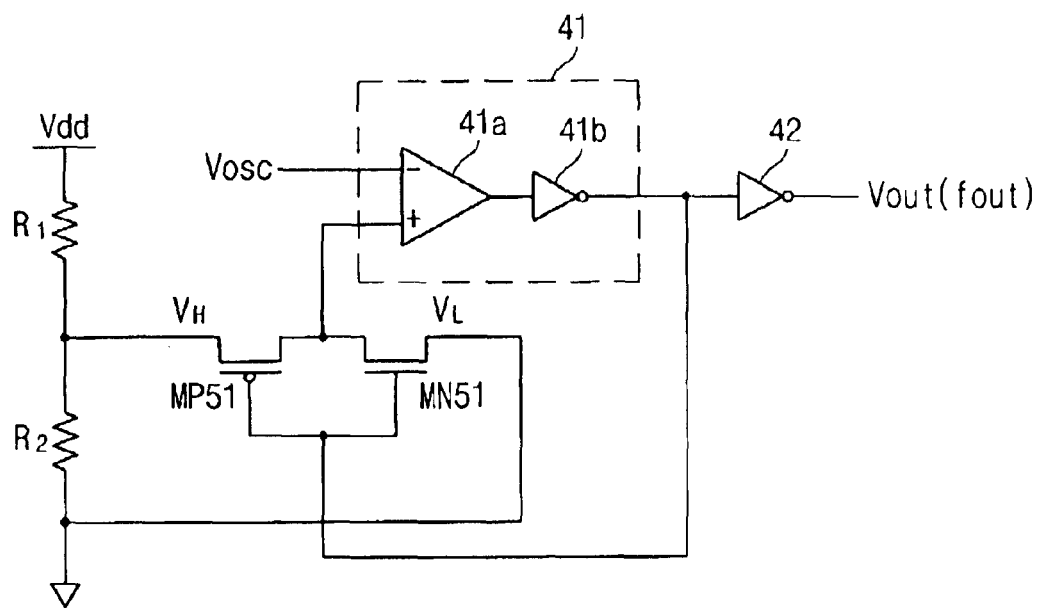
FIG. 5 is a detailed diagram showing a configuration of an amp-type Schmitt trigger shown in FIG. 3.

Operations and effects of the trans conductance oscillator according to the present invention will be described as following referring to FIG. 4 showing the circuit configuration of the trans conductance unit 30 and FIG. 5 showing circuit configuration of the amp-type Schmitt trigger 40.

First, when the input voltage $V_{in}$ is applied to the trans conductance unit 30 of the trans-conductance oscillator according to the present invention, the trans-conductance unit 30 decides the output current (lo) by setting the trans-conductance value (gm). At that time, the trans conductance value (gm) is corresponded to a value which is obtained by dividing the output current (lo) by the input voltage $V_{in}$. After that, the capacitor C is charged by the output current (lo). Herein, the voltage charged in the capacitor C has a ramp waveform.

Also, the output current (lo) is decided to be positive current (+lo) or negative current (−lo) by the amp-type Schmitt trigger 40, and the decided output current is inputted in the trans conductance unit 30 again by feed-forwarding.

As shown in FIG. 4, the trans conductance unit 30 comprises a first and a second PMOS transistors MP1 and MP2, and a first and a second NMOS transistors MN1 and MN2. In addition, the current (lo) outputted from the trans conductance unit 30 is converted into the positive current (+lo) or the negative current (−lo) by the bias voltage BIAS1 and BIAS2 and by the output of the amp-type Schmitt trigger 40, and then, outputted into output side (out).

After that, as shown in FIG. 5, the charging voltage having the ramp waveform is inputted into the comparing unit 41 of the amp-type Schmitt trigger 40. Comparing device 41a of the comparing unit 41 receives the voltage, compares the voltage to the high or low threshold voltage $V_H$ or $V_L$, and outputs the compared value after inverting it.

Figure 6:
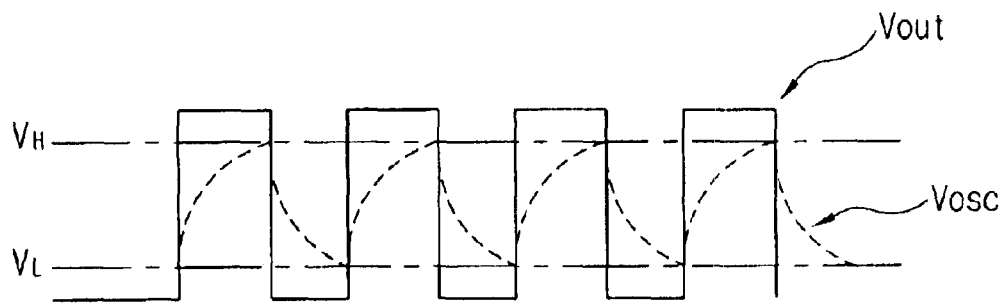
FIG. 6 is a waveform diagram showing a final output frequency ($f_{out}$) of the amp-type Schmitt trigger.

Operational process of the amp-type Schmitt trigger 40 will be described in more detail with reference to FIG. 6 showing final output frequency $f_{out}$ of the amp-type Schmitt trigger 40.

When the voltage inputted into an inversion terminal (+) of the comparing device 41a becomes the high threshold voltage $V_H$ (the reference voltage), that is, when "0" is inputted into the input terminal of the PMOS transistor MP51 and the high threshold voltage $V_H$ is inputted into the inversion terminal (+), the input voltage is converted into the output current (lo) by the output voltage $V_{out}$ of the amp-type Schmitt trigger 40 and the bias voltage BIAS1 and BIAS2 of the trans-conductance unit 30, and after that, the capacitor C is charged. Then, when the capacitor C is charged, $V_{osc}$ voltage is risen.

After that, when the $V_{osc}$ voltage is larger than the high threshold voltage $V_H$, a first inverter 41b is toggled to change the reference voltage from the high threshold voltage $V_H$ into the low threshold voltage $V_L$. Therefore, the low threshold voltage $V_L$ is inputted into the inversion terminal (+) of the comparing device 41a. In other words, "1" is inputted into the input terminal of the NMOS transistor MN51, and thereby, the low threshold voltage $V_L$ is inputted into the inversion terminal (+).

Herein, the reference voltage, that is, the high threshold voltage $V_H$ inputted into the comparing device 41a is the voltage outputted from the PMOS transistor MP51 after being dropped as much as first resistance R1 from the source voltage Vdd. On the contrary, the low threshold voltage $V_L$ is the voltage outputted through the NMOS transistor MN51 after being dropped as much as first and second resistance R1 and R2 from the source voltage Vdd.

After that, the voltage charged in the capacitor C as much as the output current (lo) is discharged, and accordingly, the $V_{osc}$ voltage is descended.

When the $V_{osc}$ voltage is smaller than the low threshold voltage $V_L$, the first inverter 41b is toggled to charge the capacitor C again.

As the above charging/discharging processes are repeated, the output voltage $V_{out}$ of the amp-type Schmitt trigger 40 outputs pulses having constant frequency as shown in FIG. 6.

On the other hand, in case that the input voltage inputted into the inversion terminal (+) is between the high threshold voltage $V_H$ and the low threshold voltage $V_L$, the previous value is maintained.

After that, Oscillation frequency $f_{out}$ outputted from the amp-type Schmitt trigger 40 finally can be expressed as following equation.

$$f_{out} = \frac{1}{\frac{1}{gm} \cdot C \cdot \ln\left[\frac{(Vdd - V_L) \cdot V_H}{(Vdd - V_H) \cdot V_L}\right]} \quad \text{[equation 1]}$$

Herein, Vdd represents the source voltage, $V_L$ represents the low threshold voltage, $V_H$ represents the high threshold voltage, and gm represents lo/Vin.

The Oscillation frequency $f_{out}$ outputted from the amp-type Schmitt trigger 40 finally is outputted to the trans conductance unit 30 and to the DC-DC converter. That is, the Oscillation frequency $f_{out}$ of the amp-type Schmitt trigger 40 is inputted as a clock signal of the DC-DC converter.

Therefore, the trans conductance oscillator according to the present invention is able to improve the frequency changing generated in the conventional oscillator, and to apply the clock signal having constant frequency to the DC-DC converter.

As described above, according to the present invention, the capacitor is charged/discharged using the trans conductance value to improve the frequency changing generated by the capacitor in the conventional oscillator using the CMOS Schmitt trigger, and therefore, the oscillator having insensitive output for the voltage and process changing can be realized.

Also, the present invention can be applied effectively to various systems in which the output frequency of the oscillator affects to the output voltage of the DC-DC converter directly.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An oscillator for a DC-DC converter comprising:

a trans-conductance unit calculating a trans-conductance value according to an input voltage, deciding and outputting a current according to the input voltage;

a capacitor charged by the current outputted from the trans-conductance unit; and an amp-type Schmitt trigger comparing a voltage charged in the capacitor to a threshold voltage, and outputting a compared value, wherein the trans-conductance unit is constructed to connect a source of a second PMOS transistor and a drain of a first PMOS transistor which a gate of the first PMOS transistor receives a first bias voltage from an inverter, and to connect a source side of a first NMOS transistor and a drain of a second NMOS transistor which a gate of the second NMOS transistor receives a second bias voltage from the inverter.

2. The oscillator of claim 1, wherein the threshold voltage is one of a high threshold voltage $V_H$ or a low threshold voltage $V_L$.

3. An oscillator for a DC-DC converter comprising:

a trans-conductance unit calculating a trans-conductance value according to an input voltage, deciding and outputting a current according to the input voltage;

a capacitor charged by the current outputted from the trans-conductance unit; and an amp-type Schmitt tripper comparing a voltage charged in the capacitor to a threshold voltage, and outputting a compared value, wherein an input end is connected commonly to a gate of a first NMOS transistor and to a gate of a second PMOS transistor, and an output end is connected to a contact point between a drain of the second PMOS transistor and a drain of the first NMOS transistor.

4. An oscillator for a DC-DC converter comprising:

a trans-conductance unit calculating a trans-conductance value according to an input voltage, deciding and outputting current according to the input voltage;

a capacitor charged by the current outputted from the trans-conductance unit; and an amp-type Schmitt trigger comparing a voltage charged in the capacitor to a threshold voltage, and outputting a compared value wherein the trans-conductance unit is constructed to connect a source of a second PMOS transistor and a drain of a first PMOS transistor which the first PMOS transistor receives a first bias voltage from an inverter, to connect an output end to a contact point between a drain of the second PMOS transistor and a drain of a first NMOS transistor, to connect a source side of the first NMOS transistor and a drain of a second NMOS transistor which the second NMOS transistor receives a second bias voltage from the inverter, and to connect an input end to the first NMOS transistor and to the second PMOS transistor commonly.

5. An oscillator of a DC-DC converter comprising:

a trans-conductance unit for outputting a positive current or a negative current according to a conductance value which is set in advance corresponding to an input voltage;

a capacitor charged by an output current from the trans-conductance unit;

a comparing unit comparing a voltage inputted from the capacitor to a threshold voltage and outputting a current of a corresponding level after inverting it; and an inverter for inverting an output signal of the comparing unit and outputting it into the trans-conductance unit and to the DC-DC converter.

6. The oscillator of claim 5, wherein the conductance value is a value obtained by dividing the output current by the input voltage.

7. The oscillator of claim 5, wherein the input voltage is one of a high threshold voltage $V_H$ or low threshold voltage $V_L$.

8. The oscillator of claim 5, wherein the trans-conductance unit is constructed to connect a source of a second PMOS transistor and a drain of a first PMOS transistor which the first PMOS transistor receives a first bias voltage from the inverter and to connect a source side of a first NMOS transistor and a drain of a second NMOS transistor which the second NMOS transistor receives a second bias voltage from the inverter.

9. The oscillator of claim 8, wherein an input end is connected to a gate of the first NMOS transistor and a gate of the second PMOS transistor commonly, and an output end is connected to a contact point between the drain of the second PMOS transistor and the drain of the first NMOS transistor.

10. The oscillator of claim 5, wherein the trans-conductance unit is constructed to connect a source of a second PMOS transistor and a drain of a first PMOS transistor which the first PMOS transistor receives a first bias voltage from the inverter, to connect an output end to a contact point between a drain of a second PMOS transistor and a drain of a first NMOS transistor, to connect a source side of the first NMOS transistor and a drain of a second NMOS transistor which the second NMOS transistor receives a second bias voltage from the inverter, and to connect an input end to the first NMOS transistor and to the second PMOS transistor commonly.

11. The oscillator of claim 5, wherein the comparing unit comprising a comparing device and the inverter compares the input voltage to a low threshold voltage or high threshold voltage, and outputs the compared value after inverting it.

12. The oscillator of claim 7, wherein the high threshold voltage is a reference voltage which is switched-on by receiving a low potential signal outputted from the comparing unit and after that, is dropped from a source voltage utilizing a resistive divider network formed by a first resistor and a second resistor.

13. The oscillator of claim 12, wherein the high threshold voltage is outputted from a PMOS transistor.

14. The oscillator of claim 7, wherein the low threshold voltage is a reference voltage which is switched-on by receiving a high potential signal outputted from the comparing unit and after that, is dropped from a source voltage utilizing a resistive divider network formed by a first resistor and a second resistor.

15. The oscillator of claim 14, wherein the low threshold voltage is outputted from a NMOS transistor.

* * * * *